(12) United States Patent
Kawamori et al.

(10) Patent No.: US 7,961,441 B2
(45) Date of Patent: Jun. 14, 2011

(54) EXCHANGE COUPLED FILM INCLUDING HAFNIUM AND AMORPHOUS LAYERS USABLE IN A MAGNETORESISTIVE ELEMENT IN A THIN-FILM MAGNETIC HEAD

(75) Inventors: Keita Kawamori, Tokyo (JP); Satoshi Miura, Tokyo (JP); Takumi Yanagisawa, Tokyo (JP)

(73) Assignee: TDK Corporation, Tokyo (JP)

( * ) Notice: Subject to any disclaimer, the term of this patent is extended or adjusted under 35 U.S.C. 154(b) by 695 days.

(21) Appl. No.: 12/020,773

(22) Filed: Jan. 28, 2008

(65) Prior Publication Data
US 2009/0191430 A1    Jul. 30, 2009

(51) Int. Cl.
*G11B 5/39* (2006.01)
(52) U.S. Cl. .................................... 360/324.11
(58) Field of Classification Search ..... 360/324.1–324.2
See application file for complete search history.

(56) References Cited

U.S. PATENT DOCUMENTS

| | | | |
|---|---|---|---|
| 5,850,323 A | 12/1998 | Kanai | |
| 6,338,899 B1 * | 1/2002 | Fukuzawa et al. | 360/324.12 |
| 6,833,981 B2 | 12/2004 | Suwabe et al. | |
| 7,494,724 B2 * | 2/2009 | Okuno et al. | 428/811.1 |
| 2003/0002228 A1 | 1/2003 | Suwabe et al. | |
| 2006/0165881 A1 | 7/2006 | Li et al. | |

FOREIGN PATENT DOCUMENTS

| | | |
|---|---|---|
| JP | A 9-16915 | 1/1997 |
| JP | A 2001-267658 | 9/2001 |
| JP | A 2003-16613 | 1/2003 |
| JP | A 2003-31866 | 1/2003 |
| JP | A 2006-210907 | 8/2006 |

* cited by examiner

*Primary Examiner* — A. J. Heinz
(74) *Attorney, Agent, or Firm* — Oliff & Berridge, PLC

(57) ABSTRACT

The exchange coupled film according to the present invention comprises a buffer layer including a laminate in which an amorphous layer and a hafnium layer are laminated in that order, an antiferromagnetic layer laminated on the hafnium layer of the buffer layer via an intermediate layer with a thickness of at least 2 nm, and a pinned magnetic layer laminated on the antiferromagnetic layer.

9 Claims, 13 Drawing Sheets (a)

| | BUFFER LAYER A | | BUFFER LAYER B | | BUFFER LAYER C | | Hex (Oe) |
|---|---|---|---|---|---|---|---|
| | MATERIAL | THICKNESS (nm) | MATERIAL | THICKNESS (nm) | MATERIAL | THICKNESS (nm) | Ni CONTENT (wt.%) | |
| EX.1 | Ta | 1 | Hf | 3 | NiFe | 2 | 90 | 1776 |
| COMP. EX.1 | Ta | 1 | NONE | | NiFe | 2 | 90 | 1302 |
| COMP. EX.2 | Ta | 1 | Zr | 3 | NiFe | 2 | 90 | 1350 |
| COMP. EX.3 | Ta | 1 | Pt | 3 | NiFe | 2 | 90 | 1290 |
| COMP. EX.4 | Ta | 1 | NiCr | 3 | NiFe | 2 | 90 | 1268 |
| COMP. EX.5 | Ta | 1 | Cu | 3 | NiFe | 2 | 90 | 1025 |

Fig.8

| | BUFFER LAYER A | | BUFFER LAYER B | | BUFFER LAYER C | | | Hex (Oe) |
|---|---|---|---|---|---|---|---|---|
| | MATERIAL | THICKNESS (nm) | MATERIAL | THICKNESS (nm) | MATERIAL | THICKNESS (nm) | Ni CONTENT (wt.%) | |
| COMP. EX.6 | Ta | 1 | Hf | 2 | NiFe | 1 | 90 | 256 |
| COMP. EX.7 | Ta | 1 | Hf | 3 | NiFe | 1 | 90 | 264 |
| COMP. EX.8 | Ta | 1 | Hf | 0 | NiFe | 2 | 90 | 1302 |
| EX. 2 | Ta | 1 | Hf | 1 | NiFe | 2 | 90 | 1349 |
| EX. 3 | Ta | 1 | Hf | 2 | NiFe | 2 | 90 | 1588 |
| EX. 4 | Ta | 1 | Hf | 3 | NiFe | 2 | 90 | 1691 |
| EX. 5 | Ta | 1 | Hf | 4 | NiFe | 2 | 90 | 1736 |
| COMP. EX.9 | Ta | 1 | Hf | 0 | NiFe | 3 | 90 | 1342 |
| EX. 6 | Ta | 1 | Hf | 1 | NiFe | 3 | 90 | 1417 |
| EX. 7 | Ta | 1 | Hf | 2 | NiFe | 3 | 90 | 1654 |
| EX. 8 | Ta | 1 | Hf | 3 | NiFe | 3 | 90 | 1746 |

Fig.10

| | BUFFER LAYER A | | BUFFER LAYER B | | BUFFER LAYER C | | | Hex (Oe) |
|---|---|---|---|---|---|---|---|---|
| | MATERIAL | THICKNESS (nm) | MATERIAL | THICKNESS (nm) | MATERIAL | THICKNESS (nm) | Ni CONTENT (wt.%) | |
| COMP. EX. 8 | Ta | 1 | Hf | 0 | NiFe | 2 | 90 | 1302 |
| COMP. EX. 9 | Ta | 1 | Hf | 0 | NiFe | 3 | 90 | 1342 |
| EX. 2 | Ta | 1 | Hf | 1 | NiFe | 2 | 90 | 1349 |
| EX. 6 | Ta | 1 | Hf | 1 | NiFe | 3 | 90 | 1417 |
| COMP. EX. 6 | Ta | 1 | Hf | 2 | NiFe | 1 | 90 | 256 |
| EX. 3 | Ta | 1 | Hf | 2 | NiFe | 2 | 90 | 1588 |
| EX. 7 | Ta | 1 | Hf | 2 | NiFe | 3 | 90 | 1654 |
| COMP. EX. 7 | Ta | 1 | Hf | 3 | NiFe | 1 | 90 | 264 |
| EX. 4 | Ta | 1 | Hf | 3 | NiFe | 2 | 90 | 1691 |
| EX. 8 | Ta | 1 | Hf | 3 | NiFe | 3 | 90 | 1746 |

Fig. 12

| | BUFFER LAYER A | | BUFFER LAYER B | | BUFFER LAYER C | | | Hex (Oe) |
|---|---|---|---|---|---|---|---|---|
| | MATERIAL | THICKNESS (nm) | MATERIAL | THICKNESS (nm) | MATERIAL | THICKNESS (nm) | Ni CONTENT (wt.%) | |
| COMP. EX. 8 | Ta | 1 | Hf | 0 | NiFe | 2 | 90 | 1302 |
| EX. 4 | Ta | 1 | Hf | 3 | NiFe | 2 | 90 | 1691 |
| EX. 9 | Ta | 1 | Hf | 3 | NiFe | 2 | 82.5 | 1718 |

EXCHANGE COUPLED FILM INCLUDING HAFNIUM AND AMORPHOUS LAYERS USABLE IN A MAGNETORESISTIVE ELEMENT IN A THIN-FILM MAGNETIC HEAD

BACKGROUND OF THE INVENTION

1. Field of the Invention

The present invention relates to an exchange coupled film, to a magnetoresistive element, and to a thin-film magnetic head.

2. Related Background Art

As the recording density of hard disk devices has risen, there has been an attendant need for higher performance in thin-film magnetic heads. One type of thin-film magnetic head that is widely used is a compound thin-film magnetic head having a structure in which a magnetoresistive (MR) element or other such magnetic detection element and an electromagnetic coil element or other such magnetic recording element are laminated. These elements are used to reproduce data signals from magnetic recording media, and to write data signals to magnetic recording media.

The magnetoresistive elements used in thin-film magnetic heads have a structure in which a non-magnetic layer is sandwiched between a pinned magnetic layer in which the direction of magnetization is fixed by an exchange coupled field applied from an antiferromagnetic layer, and a free magnetic layer in which the direction of magnetization is not fixed. The direction of magnetization of the free magnetic layer varies with the orientation of the magnetic flux emitted from the magnetic recording medium, and the resistance of the magnetoresistive element varies in proportion to the relative angle of the direction of magnetization of the pinned magnetic layer and the free magnetic layer. Accordingly, if the position of the magnetic recording medium relative to the thin-film magnetic head is moved while a constant current (sensing current) is allowed to flow to the magnetoresistive element, it is possible to read the data signal of the magnetic recording medium as a voltage signal, that is, to reproduce the data signal with the thin-film magnetic head.

As discussed above, the direction of magnetization of the pinned magnetic layer is fixed by an exchange coupled field applied from the antiferromagnetic layer, and the strength of the exchange coupled field, which determines the strength of fixing the direction of magnetization, is an important element for the reliability of a thin-film magnetic head. Specifically, if the exchange coupled field applied from the antiferromagnetic layer to the pinned magnetic layer is too weak, the direction of magnetization of the pinned magnetic layer may become angled to the original fixing direction during the operation of the thin-film magnetic head. If this should happen, the reproduction output of the thin-film magnetic head may decrease, or the asymmetry of the reproduced waveform may worsen.

To prevent such problems, the exchange coupled field applied from the antiferromagnetic layer to the pinned magnetic layer must be sufficiently strong. One technique for making this exchange coupled field stronger is to raise the crystallinity of the antiferromagnetic layer by using a suitable material for the buffer layer of the antiferromagnetic layer. For example, Japanese Laid-Open Patent Application H09-16915 discloses the use of a laminate of a tantalum layer and an NiFeCr layer or the like as a buffer layer for an antiferromagnetic layer, and Japanese Laid-Open Patent Application 2006-210907 discloses the use of a laminate of a tantalum layer and a ruthenium layer as a buffer layer for an IrMn layer, which is an antiferromagnetic layer.

Nevertheless, while the buffer layer of an antiferromagnetic layer in a conventional thin-film magnetic head does have the effect of strengthening the exchange coupled field applied from the antiferromagnetic layer to the pinned magnetic layer, there are cases when the exchange coupled field is still not strong enough, and the reliability of the thin-film magnetic head is diminished.

It is an object of the present invention to provide an exchange coupled film with higher exchange coupling strength than in the past, and a highly reliable magnetoresistive element and thin-film magnetic head in which this exchange coupled film is used.

SUMMARY OF THE INVENTION

The exchange coupled film according to the present invention comprises a buffer layer including a laminate in which an amorphous layer and a hafnium layer are laminated in that order, an antiferromagnetic layer laminated on the hafnium layer of the buffer layer via an intermediate layer with a thickness of at least 2 nm, and a pinned magnetic layer laminated on the antiferromagnetic layer.

With the exchange coupled film according to the present invention, the crystallinity of the antiferromagnetic layer is increased because the antiferromagnetic layer is laminated via an intermediate layer having a suitable thickness on a buffer layer including a laminate made of a suitable material. The result is an exchange coupled film with which a stronger exchange coupled field is applied from the antiferromagnetic layer to the pinned magnetic layer.

Furthermore, the intermediate layer preferably has a face-centered cubic structure. Because the intermediate layer has a suitable crystal structure in this case, the crystallinity of the antiferromagnetic layer is further increased. The result is an exchange coupled film with an even stronger exchange coupled field that is applied from the antiferromagnetic layer to the pinned magnetic layer.

Furthermore, the intermediate layer preferably is formed from NiFe. This further increases the crystallinity of the antiferromagnetic layer. The result is an exchange coupled film with an even stronger exchange coupled field that is applied from the antiferromagnetic layer to the pinned magnetic layer.

Furthermore, the NiFe layer preferably contains at least 63 wt % nickel. This further increases the crystallinity of the antiferromagnetic layer. The result is an exchange coupled film with an even stronger exchange coupled field that is applied from the antiferromagnetic layer to the pinned magnetic layer.

Also, the thickness of the hafnium layer is preferably at least 2 nm. This further increases the crystallinity of the antiferromagnetic layer. The result is an exchange coupled film with an even stronger exchange coupled field that is applied from the antiferromagnetic layer to the pinned magnetic layer.

Also, the amorphous layer is preferably formed from tantalum. This further increases the crystallinity of the antiferromagnetic layer. The result is an exchange coupled film with an even stronger exchange coupled field that is applied from the antiferromagnetic layer to the pinned magnetic layer.

The magnetoresistive element according to the present invention comprises the above-mentioned exchange coupled film, a non-magnetic layer laminated on the pinned magnetic layer of the exchange coupled film, and a free magnetic layer laminated on the non-magnetic layer.

With the magnetoresistive element according to the present invention, reliability is higher because there is an exchange coupled film with a strong exchange coupled field that is applied from the antiferromagnetic layer to the pinned magnetic layer.

The thin-film magnetic head according to the present invention is provided with the above-mentioned magnetoresistive element.

With the thin-film magnetic head according to the present invention, reliability is higher because there is an exchange coupled film with a strong exchange coupled field that is applied from the antiferromagnetic layer to the pinned magnetic layer.

The present invention provides an exchange coupled film with higher exchange coupling strength than in the past, and provides a highly reliable magnetoresistive element and thin-film magnetic head in which this exchange coupled film is used.

BRIEF DESCRIPTION OF THE DRAWINGS

FIG. 6 is a table of the results of measuring the exchange coupled field Hex and the film constitution in the examples and comparative examples;

FIG. 8 is a table of the results of measuring the exchange coupled field Hex and the film constitution in the examples and comparative examples;

FIG. 10 is a table of the results of measuring the exchange coupled field Hex and the film constitution in the examples and comparative examples;

FIG. 12 is a table of the results of measuring the exchange coupled field Hex and the film constitution in the examples and comparative examples.

DESCRIPTION OF THE PREFERRED EMBODIMENTS

Figure 1:
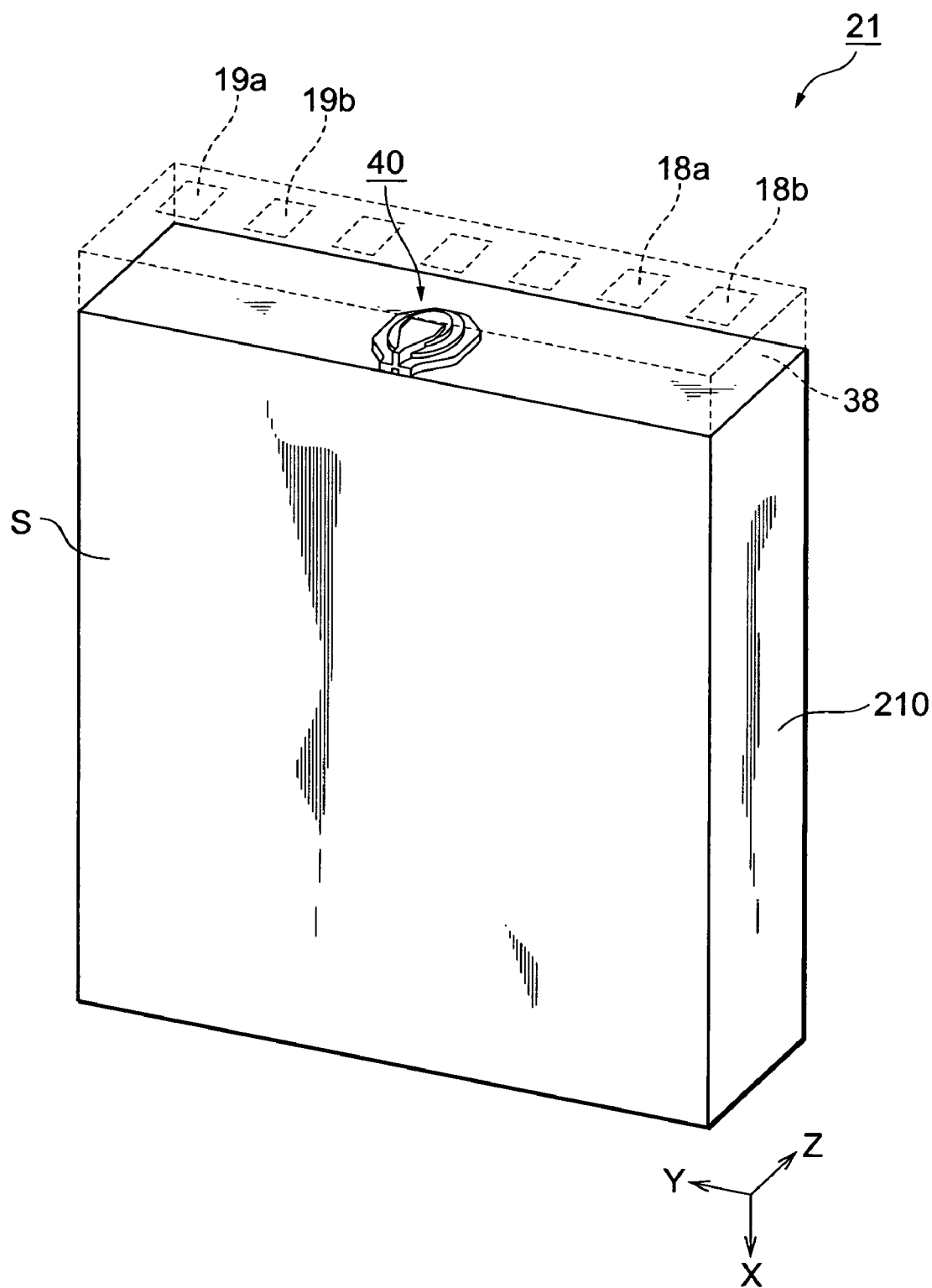
FIG. 1 is an enlarged perspective view of the magnetic head according to an embodiment.

In the following, modes for carrying out the present invention will now be described in detail through reference to the appended drawings. In the drawings, elements that are the same will be indicated using the same reference numbers. Also, the ratios of dimensions in and among constituents in the drawings are arbitrary for the convenience of viewing the drawings.

First, a magnetoresistive element and a thin-film magnetic head provided with the exchange coupled film according to an embodiment of the present invention will be described.

FIG. 1 is an enlarged perspective view of the magnetic head according to this embodiment. A thin-film magnetic head 21 comprises a magnetic head component 40 formed on a side face of a slider substrate 210 whose main component is AlTiC ($Al_2O_3$.TiC) and which is substantially cuboid in shape. The surface toward the front in the drawing is a medium-opposing surface S that is opposite the recording face of a magnetic recording medium 10 (see FIG. 2). When the magnetic recording medium 10 rotates, the air flow that accompanies this rotation causes the thin-film magnetic head 21 to float, and the medium-opposing surface S separates from the recording face of the magnetic recording medium 10. The medium-opposing surface S is machined to a specific shape so that the thin-film magnetic head 21 will properly float over the magnetic recording medium 10. An insulating layer 38 is provided as an overcoat layer (indicated by the dashed lines in the drawing) to the thin-film magnetic head 21. Recording pads 18a and 18b and reproduction pads 19a and 19b are attached on the insulating layer 38. A coating of DLC (diamond-like carbon) or the like is applied to the medium-opposing surface S.

Figure 2:
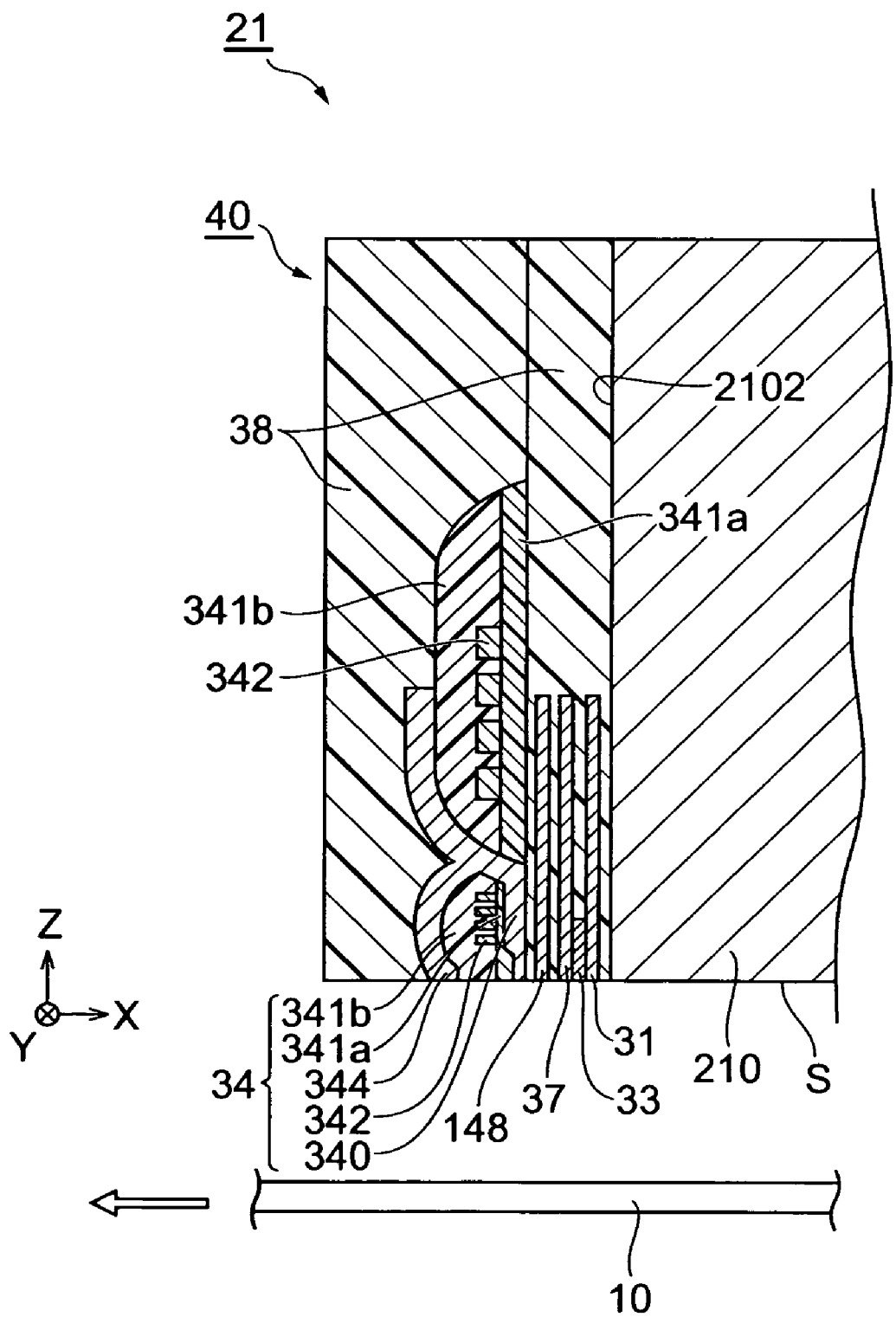
FIG. 2 is a cross section perpendicular to the medium-opposing surface S of the magnetic head according to this embodiment.

FIG. 2 is a cross section perpendicular to the medium-opposing surface S of the thin-film magnetic head 21 shown in FIG. 1, and schematically illustrates how this surface is located opposite the magnetic recording medium 10.

As shown in FIG. 2, the thin-film magnetic head 21 comprises a slider substrate 210 and a magnetic head component 40 that is laminated on a lamination face 2102 of the slider substrate 210.

The magnetic head component 40 has a magnetoresistive element 33 serving as a magnetic detection element and an electromagnetic coil element 34 serving as a magnetic recording element disposed between a lower magnetic shield layer 31 and an upper magnetic shield layer 37.

The lower magnetic shield layer 31 and the upper magnetic shield layer 37 are planar layers extending in the height direction (a direction perpendicular to the medium-opposing surface S, that is, the direction along the Z axis in FIG. 2) from the medium-opposing surface S so as to be substantially parallel to the lamination face 2102 of the slider substrate 210. The lower magnetic shield layer 31 is closer to the slider substrate 210 than the upper magnetic shield layer 37 is. Also, the lower magnetic shield layer 31 and the upper magnetic shield layer 37 form part of the medium-opposing surface S. The magnetoresistive element 33 is disposed so as to be sandwiched between the lower magnetic shield layer 31 and the upper magnetic shield layer 37, and extends in the height direction from the medium-opposing surface S.

The lower magnetic shield layer 31 and the upper magnetic shield layer 37 can be made of a magnetic material such as NiFe, CoFeNi, CoFe, FeN, or FeZrN, with a thickness of about 0.5 to 3 μm, and formed, for example, by a pattern plating method such as frame plating. The upper and lower magnetic shield layers 37 and 31 prevent the magnetoresistive element 33 from being affected by external magnetic fields that could become noise.

The magnetoresistive element 33 is, for example, a CPP (current perpendicular to plane) type of laminated film in which sensing current flows in a direction perpendicular to the lamination face (the direction along the X axis in FIG. 2), and a TMR (tunnel magneto resistance) element or a CPP-type GMR (giant magneto resistance) element can be used favorably. Using such a magnetoresistive element as the magnetoresistive element 33 makes it possible for the signal magnetic field from a magnetic disk to be sensed at an extremely high level of sensitivity. Also, when a CPP type of laminated film is used as the magnetoresistive element 33, the upper and lower magnetic shield layers 37 and 31 also function as upper and lower electrode layers, respectively, for supplying sensing current to the magnetoresistive element 33. That is, the upper and lower magnetic shield layers 37 and 31 are electrically connected to the reproduction pads 19a and 19b, respectively (see FIG. 1), and sensing current is supplied to the magnetoresistive element 33 by applying voltage between the reproduction pads 19a and 19b.

Also, as shown in FIG. 2, an inter-element magnetic shield layer 148 composed of the same material as the upper magnetic shield layer 37 is formed between the upper magnetic shield layer 37 and the electromagnetic coil element 34. The role of the inter-element magnetic shield layer 148 is to prevent external noise during reading by blocking the magnetoresistive element 33 from the magnetic field generated by the electromagnetic coil element 34. Also, a backing coil component may be formed between the inter-element magnetic shield layer 148 and the electromagnetic coil element 34. A backing coil component generates a magnetic flux that cancels out the magnetic flux loop generated from the electromagnetic coil element 34 through the upper and lower electrode layers of the magnetoresistive element 33, and thereby suppresses wide adjacent track erasure (WATE), which is an unnecessary write or erase operation on the magnetic disk.

The insulating layer 38, which is made from alumina or the like, is formed between the upper and lower magnetic shield layers 37 and 31 on the opposite side of the magnetoresistive element 33 away from the medium-opposing surface S, on the opposite side of the inter-element magnetic shield layer 148 and the upper and lower magnetic shield layers 37 and 31 away from the medium-opposing surface S, between the slider substrate 210 and the lower magnetic shield layer 31, between the upper magnetic shield layer 37 and the inter-element magnetic shield layer 148, and between the inter-element magnetic shield layer 148 and the electromagnetic coil element 34.

A CIP (current in plane) type of laminated film can also be used as the magnetoresistive element 33. In this case, the insulating layer 38 is also provided between the magnetoresistive element 33 and each of the upper and lower magnetic shield layers 37 and 31. Furthermore, in this case, although not shown in the drawings, an MR lead conductor layer is formed for supplying sensing current to the magnetoresistive element 33 and taking of reproduction output.

The electromagnetic coil element 34 is preferably used for vertical magnetic recording, and as shown in FIG. 2, comprises a main magnetic pole layer 340, a gap layer 341a, a coil insulation layer 341b, a coil layer 342, and an auxiliary magnetic pole layer 344.

The main magnetic pole layer 340 is a magnetism guiding path for guiding and converging the magnetic flux induced by the coil layer 342 to the recording layer of the magnetic recording medium 10 being written to. Here, it will be preferred if the end part of the main magnetic pole layer 340 on the medium-opposing surface S side has a width in the track width direction (direction along the Y axis in FIG. 2) and a thickness in the laminating length direction (direction along the X axis in FIG. 2) which are smaller than those in the remaining part. This makes it possible to generate fine, strong writing magnetic fields adapted to a high recording density.

The end on the medium-opposing surface S side of the auxiliary magnetic pole layer 344, which is magnetically joined to the main magnetic pole layer 340 forms a trailing shield part having a broader layer cross section than in other portions of the auxiliary magnetic pole layer 344. The auxiliary magnetic pole layer 344 is opposite the end of the main magnetic pole layer 340 on the medium-opposing surface S side, via the gap layer 341a and the coil insulation layer 341b formed from alumina or another such insulating material. Providing this auxiliary magnetic pole layer 344 results in a steeper magnetic field gradient between the main magnetic pole layer 340 and the auxiliary magnetic pole layer 344 near the medium-opposing surface S. Therefore, there is less jitter in the signal output, and the error rate can be reduced during reading.

The auxiliary magnetic pole layer 344 is made up of an alloy composed of two or three of nickel, iron, and cobalt, or an alloy in which these elements are the main components, etc., to which other specific elements have been added, and formed, for example, by frame plating, sputtering, or another such method, in a thickness of about 0.5 to about 5 µm.

The gap layer 341a separates the coil layer 342 and the main magnetic pole layer 340, and is made up of $Al_2O_3$, DLC, or the like, formed by sputtering, CVD, or another such method, in a thickness of about 0.01 to about 0.5 µm, for example.

The coil layer 342 is made up of copper or the like, formed by frame plating or another such method, in a thickness of about 0.5 to about 3 µm, for example. The rear end of the main magnetic pole layer 340 is joined with the portion of the auxiliary magnetic pole layer 344 that is away from the medium-opposing surface S, and the coil layer 342 is formed so as to surround this joined portion. The coil layer 342 is electrically connected to the recording pads 18a and 18b (see FIG. 1), and when voltage is applied between the recording pads 18a and 18b, current flows to the coil layer 342, and a write-use magnetic flux is excited by this current.

The coil insulation layer 341b separates the coil layer 342 and the auxiliary magnetic pole layer 344, and is made up of an electrically insulating material such as heat-cured alumina or a resist layer, in a thickness of about 0.1 to about 5 µm, for example.

Also, the insulating layer 38 is formed as an overcoat layer so as to cover the electromagnetic coil element 34 on the opposite side of the electromagnetic coil element 34 away from the slider substrate 210.

Figure 3:
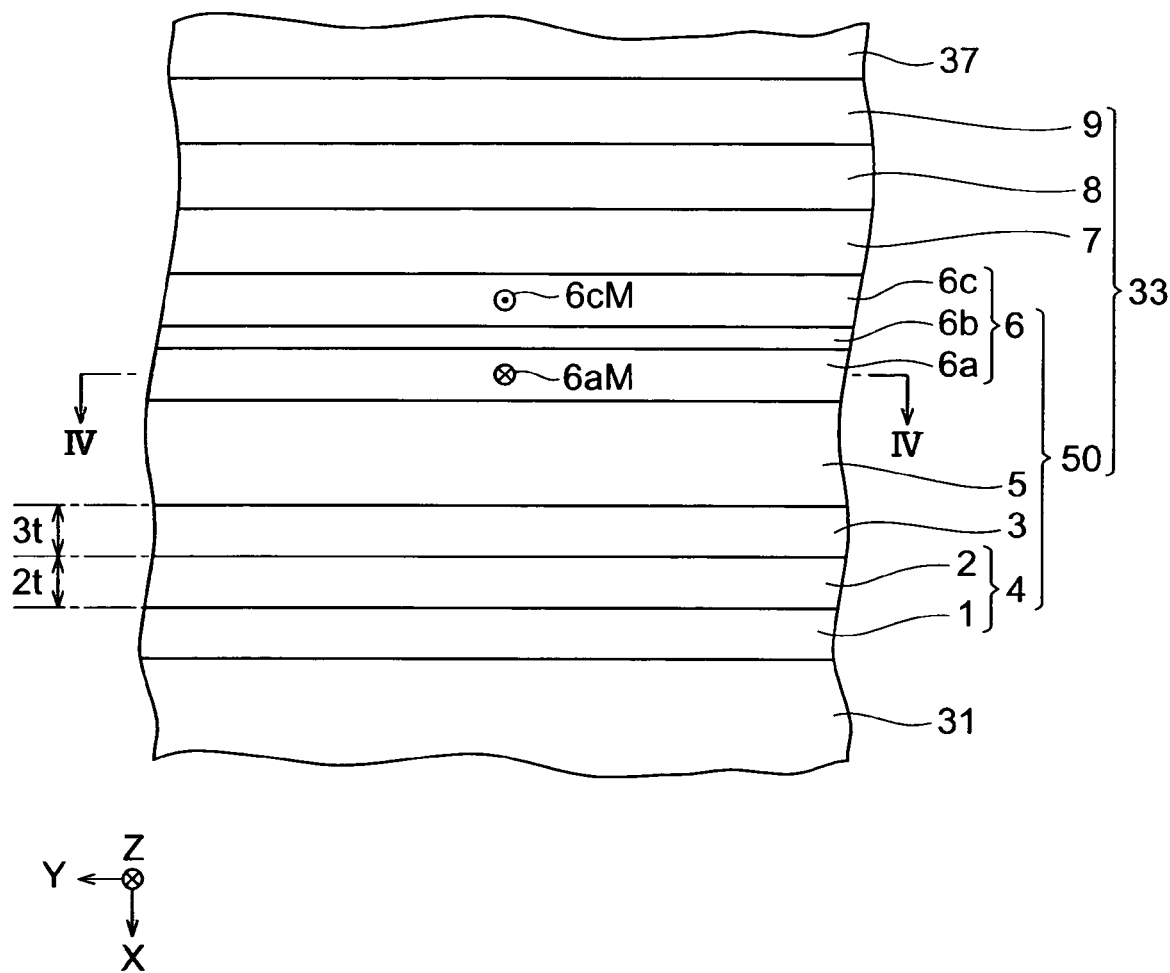
FIG. 3 is a plan view of the area near a magnetoresistive element 33 of a thin-film magnetic head 21, seen from the medium-opposing surface S side.
Figure 4:
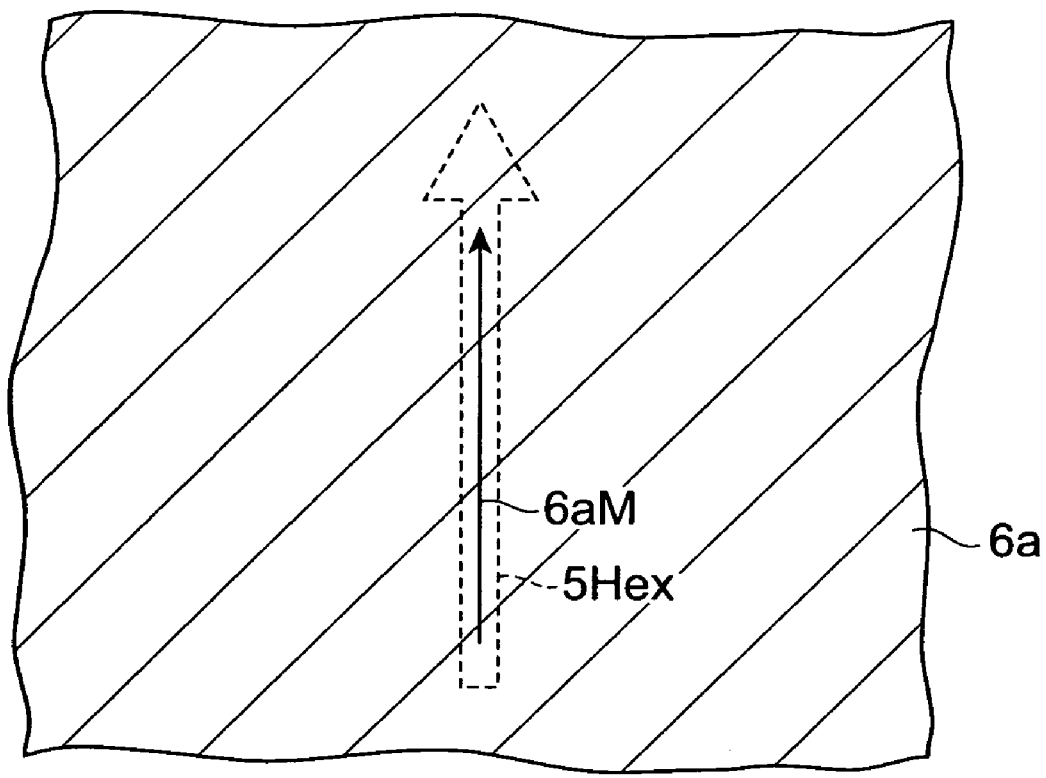
FIG. 4 is a cross section of the magnetoresistive element 33 along the IV-IV line in FIG. 3.

Next, the constitution of the magnetoresistive element 33 will be described in detail. FIG. 3 is a plan view of the area near the magnetoresistive element 33 of the thin-film magnetic head 21, from the side of the medium-opposing surface S. FIG. 4 is a cross section of the magnetoresistive element 33 along the IV-IV line in FIG. 3.

As shown in FIG. 3, the magnetoresistive element 33 provided between the lower magnetic shield layer 31 and the upper magnetic shield layer 37 has a buffer layer 4, an intermediate layer 3 laminated on the buffer layer 4, an antiferromagnetic layer 5 laminated on the intermediate layer 3, a pinned magnetic layer 6 laminated on the antiferromagnetic layer 5, a non-magnetic layer 7 laminated on the pinned magnetic layer 6, a free magnetic layer 8 laminated on the non-magnetic layer 7, and a protective layer 9 laminated on the free magnetic layer 8. Here, an exchange coupled film 50 according to this embodiment is made up of the buffer layer 4, the intermediate layer 3, the antiferromagnetic layer 5, and the pinned magnetic layer 6.

The buffer layer 4 is a laminate in which an amorphous layer 1 is laminated on the lower magnetic shield layer 31, and a hafnium layer 2 is laminated on the amorphous layer 1, in that order. These layers can be formed by sputtering or another such method, for example.

The amorphous layer 1 is formed from an amorphous material such as tantalum, CoZrTa, or CoFeB. The thickness of the amorphous layer 1 can be from 0.5 to 70 nm, for example. The thickness $2t$ of the hafnium layer 2 is preferably at least 2 nm, and preferably no more than 10 nm. Because the amorphous layer 1 is not crystallized, the crystallinity of the layer at the lower part of the exchange coupled film 50 (in the case of this embodiment, the lower magnetic shield layer 31) has almost no effect on the crystallinity of the layers higher than the amorphous layer 1 in the exchange coupled film 50.

The intermediate layer 3 can be formed from a material having a face-centered cubic structure, such as NiFe or NiCr, or a material having a hexagonal closest packing structure, such as ruthenium, or the like. If the intermediate layer 3 is formed from NiFe, the proportion of nickel in the intermediate layer 3 is preferably at least 63 wt %, and preferably no more than 99 wt %. This is because NiFe more readily takes on a face-centered cubic structure within this compositional range. The thickness $3t$ of the intermediate layer 3 is at least 2 nm. The thickness $3t$ is preferably no more than 20 nm.

When a TMR element is used as the magnetoresistive element 33, it will have a structure comprising, on the intermediate layer 3, the successive lamination of the antiferromagnetic layer 5, which is formed in a thickness of about 5 to 15 nm from an antiferromagnetic material; the pinned magnetic layer 6; a tunnel barrier layer 7, which is composed of a non-magnetic dielectric material, in which a metal film composed of aluminum, AlCu, magnesium, or the like and having a thickness of about 0.5 to 1 nm has been oxidized by natural oxidation or by oxygen introduced into a vacuum apparatus; the free magnetic layer 8, which is made up of a two-layer film consisting of CoFe or the like with a thickness of about 1 nm and NiFe or the like with a thickness of about 3 to 4 nm, which are ferromagnetic materials, and which forms a tunnel junction with the pinned magnetic layer 6 via a tunnel barrier layer; and the protective layer 9, which is composed of ruthenium, tantalum, or the like and has a thickness of about 1 to 5 nm. The various layers can be formed by sputtering, for example. The magnetoresistive element 33 need not have the protective layer 9.

The antiferromagnetic layer 5 is preferably formed from a material having a face-centered cubic structure, such as IrMn, PtMn, NiMn, or RuRhMn. If the antiferromagnetic layer 5 is formed from a material having a face-centered cubic structure, it is preferable, from the standpoint of raising the crystallinity of the antiferromagnetic layer 5, for the intermediate layer 3 to be formed from a material having a face-centered cubic structure or a hexagonal closest packing structure.

The pinned magnetic layer 6 has a first pinned magnetic layer 6$a$ in which a magnetization direction 6$a$M is fixed in the positive direction of the Z axis by an exchange coupled field 5Hex applied from the antiferromagnetic layer 5 (see FIG. 4), an intermediate pinned magnetic layer 6$b$ composed of ruthenium or another such non-magnetic metal layer, and a second pinned magnetic layer 6$c$ in which a magnetization direction 6$c$M is fixed in a direction parallel to the magnetization direction 6$a$M (the negative direction of the Z axis) via the intermediate pinned magnetic layer 6$b$.

Also, if a CPP type of GMR film is used as the magnetoresistive element 33, then the magnetoresistive element 33 will be such that the tunnel barrier layer 7 in the above-mentioned TMR film is replaced with a non-magnetic conductive layer with a thickness of about 1 to 3 nm and composed of copper or the like.

With the exchange coupled film 50 according to this embodiment, since the antiferromagnetic layer 5 is laminated via the intermediate layer 3, which has a suitable thickness, on the buffer layer 4, which includes a laminate made of a suitable material, the crystallinity of the antiferromagnetic layer 5 is increased (see FIG. 3). More specifically, crystallinity is improved because the intermediate layer 3 laminated on the buffer layer 4 composed of the amorphous layer 1 and the hafnium layer 2 has a thickness of at least 2 nm. The result is higher crystallinity of the antiferromagnetic layer 5 laminated on the intermediate layer 3. Also, because the amorphous layer 1 is not crystallized, the crystallinity of the layer at the lower part of the exchange coupled film 50 (the lower magnetic shield layer 31 in the case of the embodiment discussed above) is almost unaffected by the crystallinity of the layers of the exchange coupled film 50 higher than the amorphous layer 1. The result of all this is an exchange coupled film 50 in which the exchange coupled field 5Hex (see FIG. 4) applied from the antiferromagnetic layer 5 to the pinned magnetic layer 6 is very strong.

Also, with the magnetoresistive element 33 according to this embodiment as described above, reliability is higher because there is the exchange coupled film 50 with a strong exchange coupled field 5Hex applied from the antiferromagnetic layer 5 to the pinned magnetic layer 6 (see FIG. 3).

Also, with the thin-film magnetic head 21 according to this embodiment as described above, reliability is higher because there is the exchange coupled film 50 with a strong exchange coupled field 5Hex applied from the antiferromagnetic layer 5 to the pinned magnetic layer 6 (see FIGS. 2 and 3).

Further, with the exchange coupled film 50, the magnetoresistive element 33, and the thin-film magnetic head 21 according to this embodiment, the intermediate layer 3 preferably has a face-centered cubic structure. Accordingly, the crystallinity of the antiferromagnetic layer 5 is higher, and the exchange coupled field 5Hex applied from the antiferromagnetic layer 5 to the pinned magnetic layer 6 is stronger. The strength of the exchange coupled field 5Hex is particularly high when the antiferromagnetic layer 5 is formed from a material having a face-centered cubic structure. As a result, an exchange coupled film 50 is obtained with an even stronger exchange coupled field 5Hex, and a magnetoresistive element 33 and thin-film magnetic head 21 are obtained with even higher reliability.

Furthermore, with the exchange coupled film 50, the magnetoresistive element 33, and the thin-film magnetic head 21 according to this embodiment, the intermediate layer 3 is preferably formed from NiFe. Accordingly, the crystallinity of the antiferromagnetic layer 5 is higher, and the exchange coupled field 5Hex applied from the antiferromagnetic layer 5 to the pinned magnetic layer 6 is stronger. As a result, an exchange coupled film 50 is obtained with an even stronger exchange coupled field 5Hex, and a magnetoresistive element 33 and thin-film magnetic head 21 are obtained with even higher reliability.

Further, with the exchange coupled film 50, the magnetoresistive element 33, and the thin-film magnetic head 21 according to this embodiment, when the intermediate layer 3 is formed from NiFe, the intermediate layer 3 preferably contains at least 63 wt % nickel. Accordingly, the crystallinity of the antiferromagnetic layer 5 is higher, and the exchange coupled field 5Hex applied from the antiferromagnetic layer 5 to the pinned magnetic layer 6 is stronger. As a result, an exchange coupled film 50 is obtained with an even stronger exchange coupled field 5Hex, and a magnetoresistive element 33 and thin-film magnetic head 21 are obtained with even higher reliability.

Further, with the exchange coupled film 50, the magnetoresistive element 33, and the thin-film magnetic head 21 according to this embodiment, the thickness of the hafnium layer 2 is preferably at least 2 nm. Accordingly, the crystallinity of the antiferromagnetic layer 5 is higher, and the exchange coupled field 5Hex applied from the antiferromagnetic layer 5 to the pinned magnetic layer 6 is stronger. As a result, an exchange coupled film 50 is obtained with an even stronger exchange coupled field 5 Hex, and a magnetoresistive element 33 and thin-film magnetic head 21 are obtained with even higher reliability.

Further, with the exchange coupled film 50, the magnetoresistive element 33, and the thin-film magnetic head 21 according to this embodiment, the amorphous layer 1 is formed from tantalum. Accordingly, the crystallinity of the antiferromagnetic layer 5 is higher, and the exchange coupled field 5Hex applied from the antiferromagnetic layer 5 to the pinned magnetic layer 6 is stronger. As a result, an exchange coupled film 50 is obtained with an even stronger exchange coupled field 5Hex, and a magnetoresistive element 33 and thin-film magnetic head 21 are obtained with even higher reliability.

The effect of the present invention will now be further clarified by giving examples and comparative examples.

The following examples and comparative examples involve measurement samples used in experiments for examining the dependency on the buffer layer of the size of the exchange coupled field Hex applied from the antiferromagnetic layer. First, the method for measuring the exchange coupled field Hex will be described.

Figure 5:
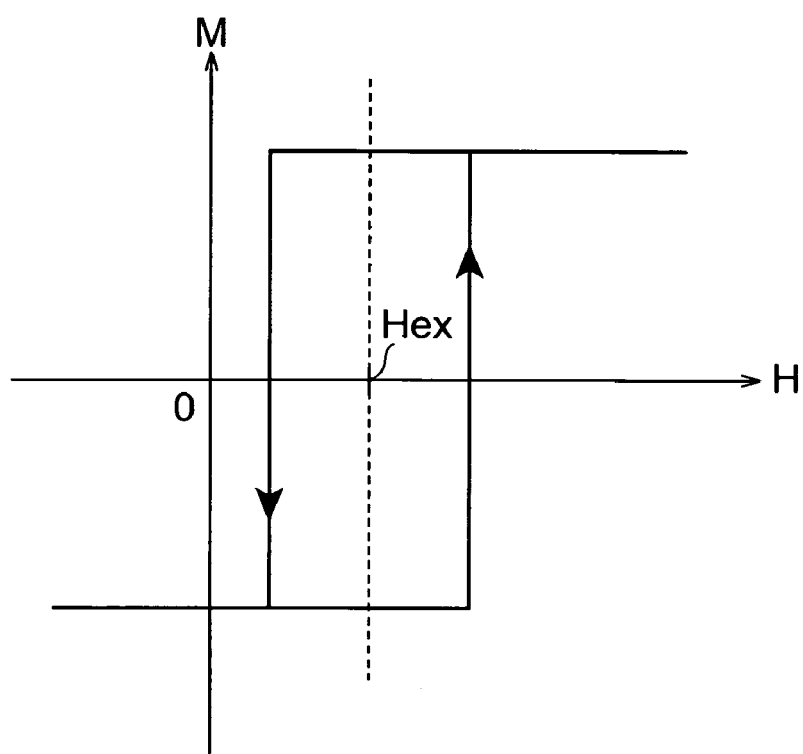
FIG. 5(a) is a diagram that defines the exchange coupled field Hex when an M-H curve is measured.
FIG. 5(b) is a diagram that defines the exchange coupled field Hex when an R—H curve is measured.
Figure 5:
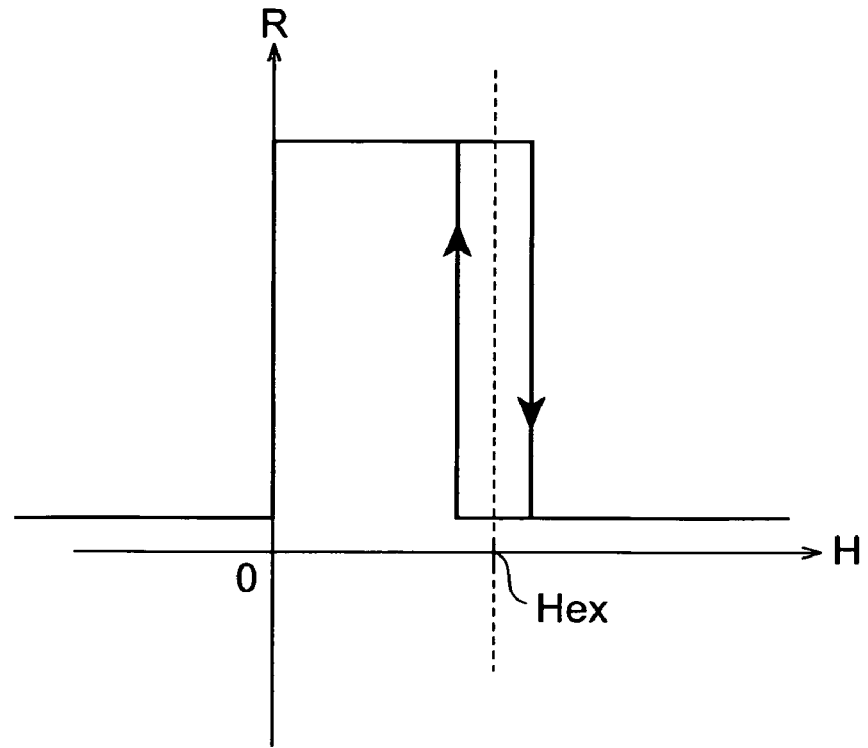

There are two main methods for measuring the exchange coupled field Hex. With the first method, a measurement sample is prepared that has a laminate comprising a buffer layer, an intermediate layer, an antiferromagnetic layer, and a pinned magnetic layer (ferromagnetic layer) laminated in that order. The external magnetic field H dependency of the magnetization M shown in FIG. 5(a) is then measured, for example, with a VSM (vibrating sample magnetometer). The value of the external magnetic field H corresponding to the center of the hysteresis portion of this M-H curve is the exchange coupled field Hex.

With the second method, a measurement sample (GMR laminate film) is prepared that has a laminate comprising a buffer layer, an antiferromagnetic layer, a pinned magnetic layer (ferromagnetic layer), a non-magnetic layer, and a free magnetic layer (ferromagnetic layer) laminated in that order. The external magnetic field H dependency of the resistance value R shown in FIG. 5(b) is then measured by measuring the resistance of this sample in an external magnetic field by the four-terminal method, etc. The value of the external magnetic field H corresponding to the center of the of the hysteresis portion of this R—H curve is the exchange coupled field Hex.

In the examples and comparative examples given below, the values of the exchange coupled field Hex were measured by the above-mentioned second method. The film configuration in the examples and comparative examples was such that a buffer layer A, buffer layer B, buffer layer C, IrMn layer (7 nm), CoFe (3 nm), copper (2 nm), CoFe (1 nm), NiFe (3 nm), ruthenium (1 nm), and tantalum (3 nm) were laminated in that order. The buffer layer A was formed from tantalum in a film thickness of 1 nm and the buffer layer C was formed from NiFe. The buffer layers A, B, and C correspond to the amorphous layer 1, the hafnium layer 2, and the intermediate layer 3, respectively, in the above-mentioned embodiment.

Figure 7:
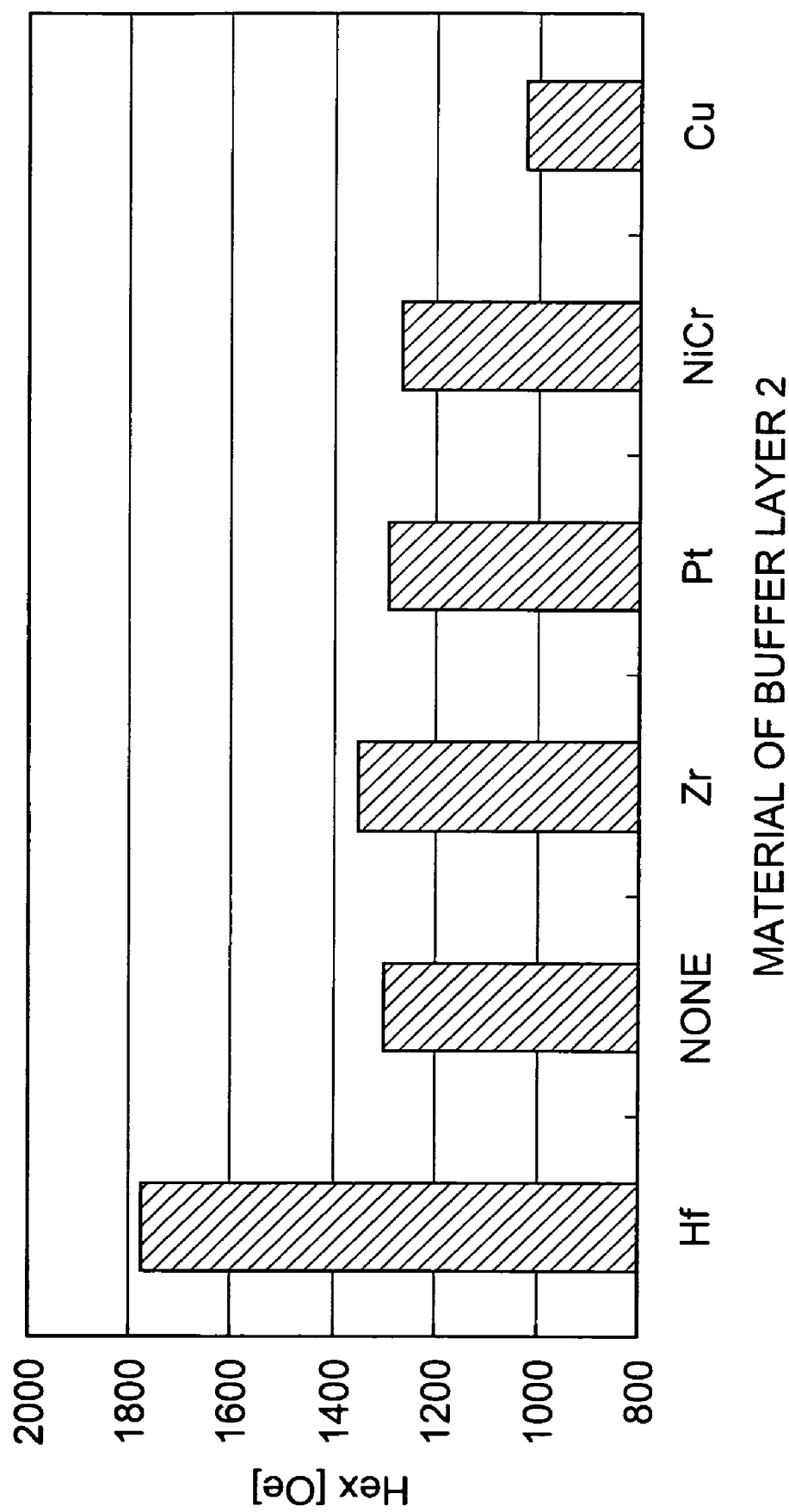
FIG. 7 is a graph of the dependence of the exchange coupled field Hex on the material of a buffer layer B.

FIGS. 6 and 7 show the conditions and measurement results for Example 1 and Comparative Examples 1 to 5. As shown in FIG. 6, the buffer layer C in Example 1 and Comparative Examples 1 to 5 was formed from NiFe in a film thickness of 2 nm, with a nickel content of 90 wt %, and buffer layers A and C had the same constitution. Specifically, in Example 1 and Comparative Examples 1 to 5, buffer layer B was formed from a different material and in a different thickness. FIG. 7 shows the dependency of the exchange coupled field Hex in Example 1 and Comparative Examples 1 to 5 on the material of the buffer layer B. As is clear from this graph, when hafnium was used as the buffer layer B (Example 1), the value of the exchange coupled field Hex was greater than when a material other than hafnium was used as the buffer layer B (Comparative Examples 2 to 5) and when there was no buffer layer B (Comparative Example 1).

Figure 9:
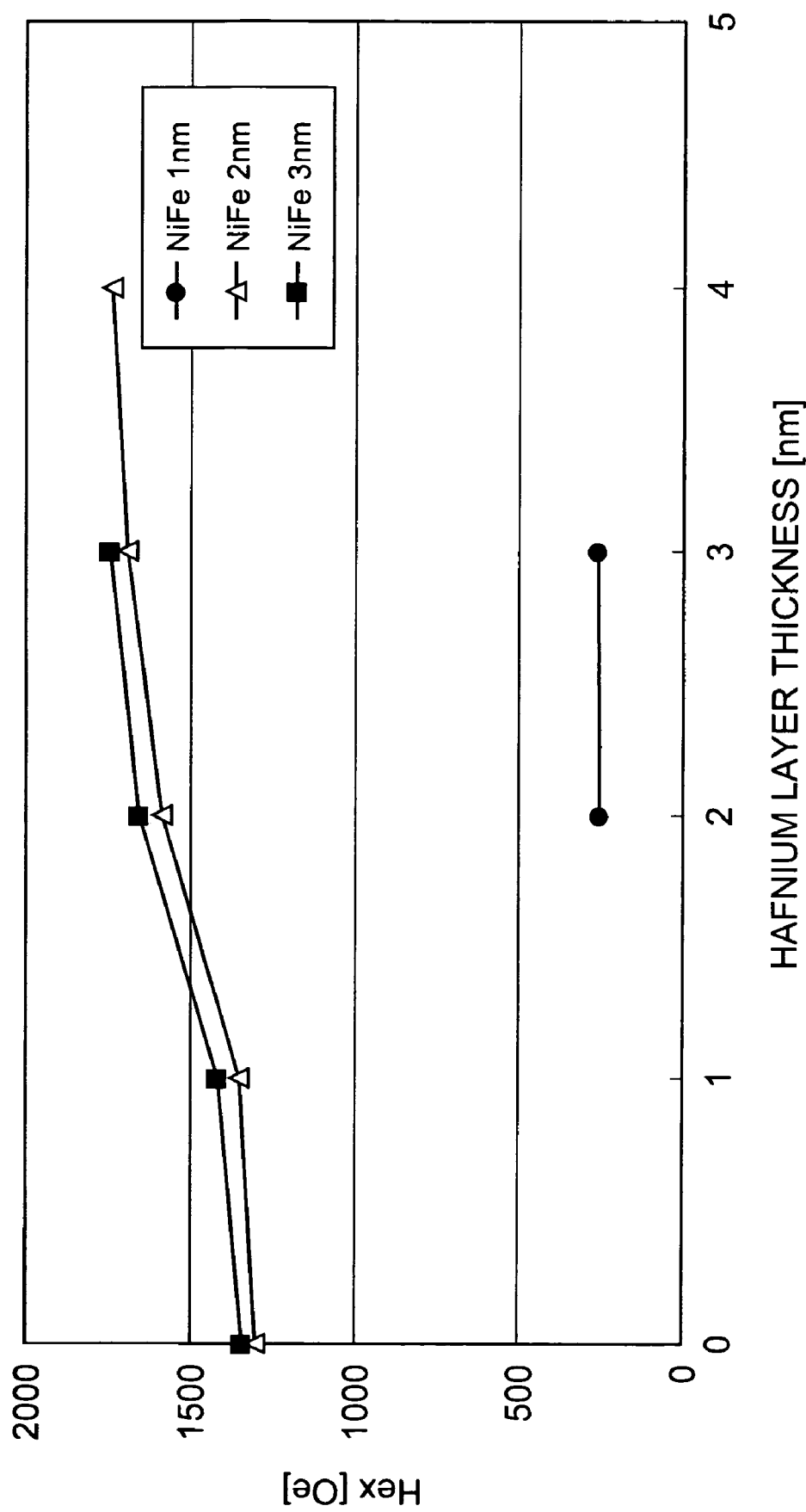
FIG. 9 is a graph of the dependence of the exchange coupled field Hex on the hafnium layer thickness in the examples and comparative examples.

FIGS. 8 and 9 show the conditions and measurement results for Examples 2 to 8 and Comparative Examples 6 to 9. As shown in FIG. 8, the buffer layer C in Examples 2 to 8 was NiFe in a film thickness of 2 or 3 nm, but buffer layer C in Comparative Examples 6 and 7 was NiFe in a film thickness of 1 nm. Also, in Examples 2 to 8 the buffer layer B was a hafnium layer with a thickness of 1 to 4 nm, but in Comparative Examples 8 and 9 no buffer layer B was provided. Also, the buffer layer C in Examples 2 to 8 and Comparative Examples 6 to 9 was formed from NiFe with a nickel content of 90 wt % and in a thickness of 1 to 3 nm. FIG. 9 shows the dependency of the exchange coupled field Hex in Examples 2 to 8 and Comparative Examples 6 to 9 on the thickness of the buffer layer B (hafnium layer). As is clear from this graph, the value of the exchange coupled field Hex was greater when a hafnium layer was provided, and particularly when the thickness of the hafnium layer was at least 2 nm, than when no hafnium layer was provided (Comparative Examples 8 and 9).

Figure 11:
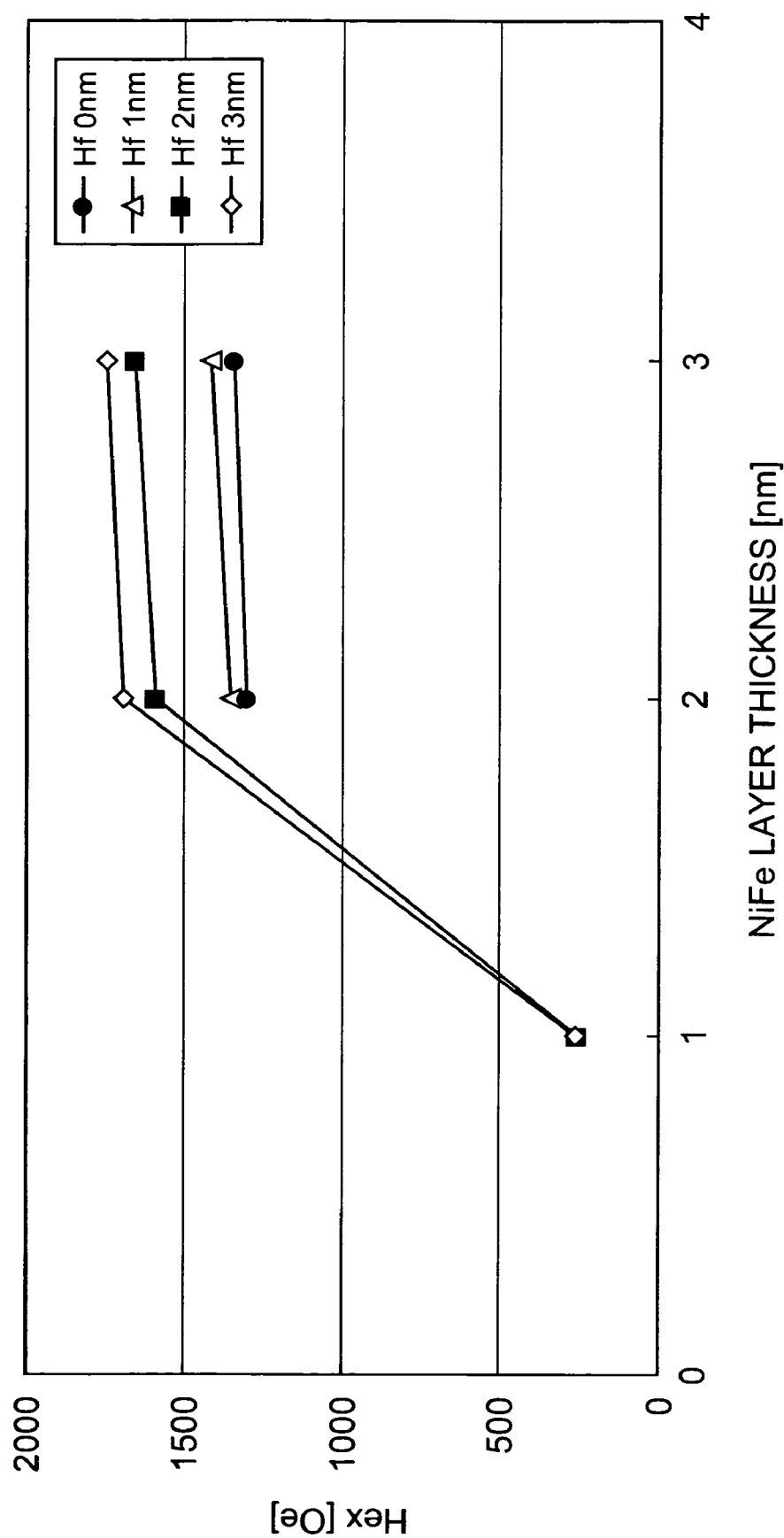
FIG. 11 is a graph of the dependence of the exchange coupled field Hex on the NiFe layer thickness in the examples and comparative examples.

FIGS. 10 and 11 show the conditions and measurement results for Examples 2 to 4 and 6 to 8 and Comparative Examples 6 to 9. As shown in FIG. 10, a hafnium layer with a thickness of 1 to 3 nm was used as the buffer layer B in Examples 2 to 4 and 6 to 8, but no buffer layer B was provided in Comparative Examples 8 and 9. The buffer layer C of Examples 2 to 4 and 6 to 8 and Comparative Examples 6 to 9 was formed from NiFe with a nickel content of 90 wt % and in a film thickness of 1 to 3 nm. FIG. 11 shows the dependency of the exchange coupled field Hex in Examples 2 to 4 and 6 to 8 and Comparative Examples 6 to 9 on the thickness of the buffer layer C (NiFe layer). As is clear from this graph, the value of the exchange coupled field Hex was greater when the thickness of the NiFe layer was at least 2 nm, than when the NiFe layer was only 1 nm (Comparative Examples 6 and 7).

Figure 13:
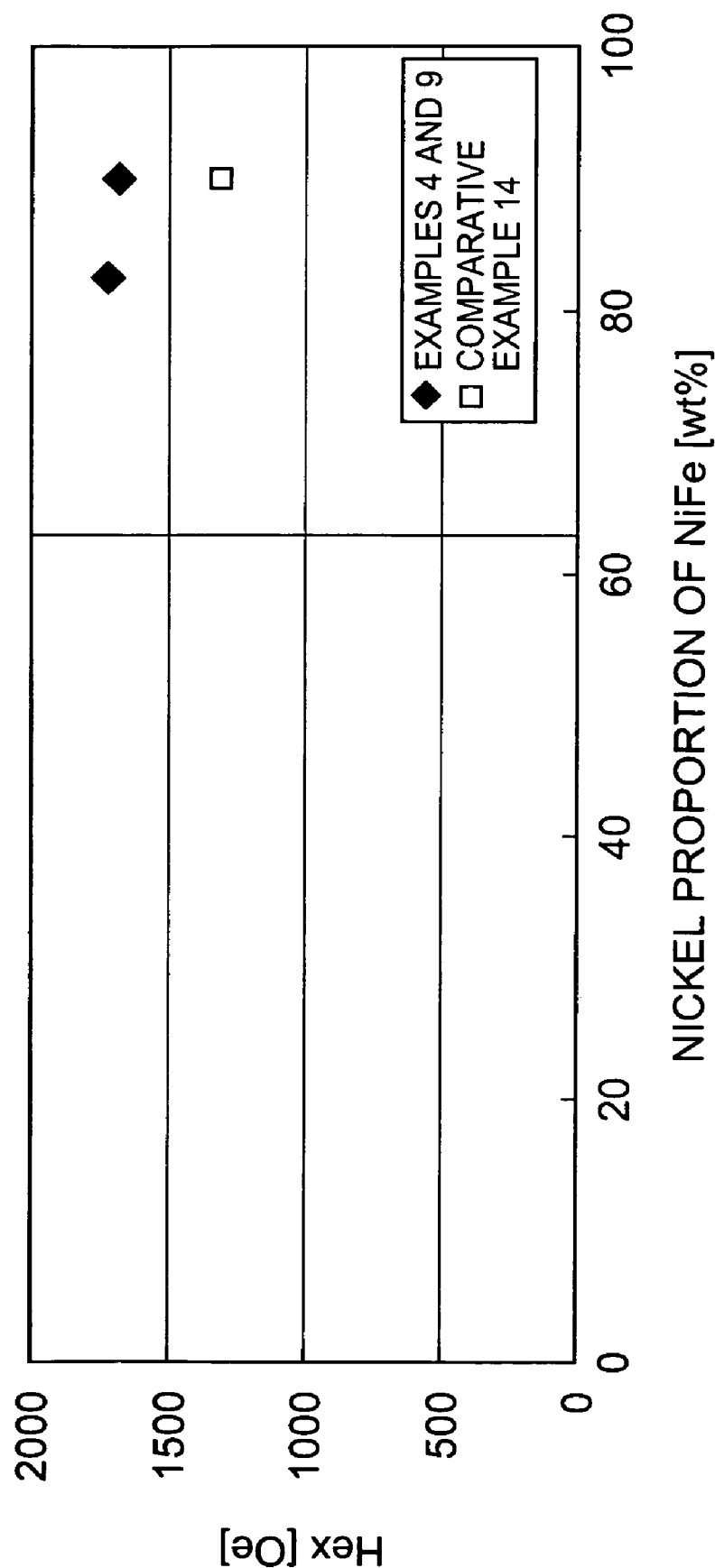
FIG. 13 is a graph of the dependence of the exchange coupled field Hex on the NiFe layer composition in the examples and comparative examples.

FIGS. 12 and 13 show the conditions and measurement results for Examples 4 and 9 and Comparative Example 8. As shown in FIG. 12, in Examples 4 and 9 hafnium in a film thickness of 3 nm was used as the buffer layer B, but in Comparative Example 8 no buffer layer B was provided. Also, in Examples 4 and 9 and Comparative Example 8, the film thickness of the buffer layer C was 2 nm, and NiFe with a nickel content of 82.5 to 90 wt % was used in Examples 4 and 9, while NiFe with a nickel content of 90 wt % was used in Comparative Example 8. FIG. 13 shows the dependency of the exchange coupled field Hex in Examples 4 and 9 and Comparative Example 8 on the nickel content of the buffer layer C (NiFe layer). As is clear from this graph, the value of the exchange coupled field Hex was greater when the nickel content of the NiFe layer was at least 63 wt %. With the crystal structure of NiFe, it is believed that the value of the exchange coupled field Hex was greater due to the fact that the proportion of face-centered cubic structure in a composition of at least 63 wt % nickel is particularly great.

The present invention is not limited to the embodiments and examples given above, and various modifications are possible.

For instance, the pinned magnetic layer 6 of the magnetoresistive element 33 consisted of the first pinned magnetic layer 6a, the intermediate pinned magnetic layer 6b, and the second pinned magnetic layer 6c (see FIG. 3), but the pinned magnetic layer 6 may instead consist only of the second pinned magnetic layer 6c. That is, the pinned magnetic layer 6 may consist of a single ferromagnetic layer.

Also, the buffer layer 4 consisted of a laminate in which the amorphous layer 1 and the hafnium layer 2 were laminated in that order (see FIG. 3), but the buffer layer 4 may further comprise a layer provided in between the amorphous layer 1 and the lower magnetic shield layer 31. This may in some cases further raise the crystallinity of the antiferromagnetic layer 5.

Also, in addition to a thin-film magnetic head, the exchange coupled film and magnetoresistive element according to the present invention can be applied to an MRAM (magnetoresistive random access memory) or a magnetic sensor.

What is claimed is:

1. An exchange coupled film, comprising:
    a buffer layer including a laminate in which an amorphous layer and a hafnium layer are laminated in that order;
    an antiferromagnetic layer laminated on the hafnium layer of the buffer layer via an intermediate layer with a thickness of at least 2 nm; and
    a pinned magnetic layer laminated on the antiferromagnetic layer, wherein the amorphous layer is in direct contact with the hafnium layer.

2. The exchange coupled film according to claim 1, wherein the intermediate layer has a face-centered cubic structure.

3. The exchange coupled film according to claim 2, wherein the intermediate layer is formed from NiFe.

4. The exchange coupled film according to claim 3, wherein the NiFe layer contains at least 63 wt % nickel and no more than 99 wt % nickel.

5. The exchange coupled film according to claim 1, wherein the thickness of the hafnium layer is at least 2 nm.

6. The exchange coupled film according to claim 1, wherein the amorphous layer is formed from tantalum.

7. A magnetoresistive element, comprising:
    the exchange coupled film according to claim 1;
    a non-magnetic layer laminated on the pinned magnetic layer of the exchange coupled film; and
    a free magnetic layer laminated on the non-magnetic layer.

8. A thin-film magnetic head provided with the magnetoresistive element according to claim 7.

9. The exchange coupled film according to claim 1, wherein the thickness of the amorphous layer is from 0.5 nm to 70 nm.

* * * * *